US012796307B2

(12) United States Patent
Xue et al.

(10) Patent No.: US 12,796,307 B2
(45) Date of Patent: Nov. 10, 2026

(54) DISPLAY SUBSTRATE AND DISPLAY DEVICE

(71) Applicant: BOE Technology Group Co., Ltd., Beijing (CN)

(72) Inventors: Jinxiang Xue, Beijing (CN); Zhongyuan Sun, Beijing (CN); Wenqi Liu, Beijing (CN); Jingkai Ni, Beijing (CN); Che An, Beijing (CN); Fang Liu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 363 days.

(21) Appl. No.: 18/034,078

(22) PCT Filed: Dec. 22, 2020

(86) PCT No.: PCT/CN2020/138247
§ 371 (c)(1),
(2) Date: Apr. 27, 2023

(87) PCT Pub. No.: WO2022/133711
PCT Pub. Date: Jun. 30, 2022

(65) Prior Publication Data
US 2023/0397479 A1 Dec. 7, 2023

(51) Int. Cl.
*H10K 77/10* (2023.01)
*H10K 59/131* (2023.01)
(Continued)

(52) U.S. Cl.
CPC ......... *H10K 77/111* (2023.02); *H10K 59/131* (2023.02); *H10K 59/82* (2023.02); *H10K 77/00* (2023.02)

(58) Field of Classification Search
None
See application file for complete search history.

(56) References Cited

U.S. PATENT DOCUMENTS 12,191,425 B2 * 1/2025 Yang .................. H01L 25/0753
2016/0111481 A1 4/2016 Jeong et al.
(Continued)

FOREIGN PATENT DOCUMENTS

CN 109148546 A 1/2019
CN 110176473 A 8/2019
(Continued)

OTHER PUBLICATIONS

Machine translation of CN-110993673-A (Year: 2020).*
(Continued)

*Primary Examiner* — Bryan R Junge

(57) ABSTRACT

The present application provides a display substrate and a display device. The display substrate comprises: a base substrate, wherein the base substrate has stretching areas and a plurality of display areas, the plurality of display areas are spaced apart from each other by the stretching areas, the stretching area has first connection units connecting two adjacent display areas and a hollow part jointly defined by a plurality of the first connection units; and light emitting elements, wherein the light-emitting elements are arranged on one side of the base substrate, and the stretching areas and the display areas both have the light-emitting elements.

12 Claims, 10 Drawing Sheets

(51) Int. Cl.
*H10K 59/82* (2023.01)
*H10K 77/00* (2023.01)

(56) References Cited

U.S. PATENT DOCUMENTS

| | | | | |
|---|---|---|---|---|
| 2016/0320878 | A1* | 11/2016 | Hong | G09G 3/3233 |
| 2017/0040306 | A1* | 2/2017 | Kim | H01L 23/49894 |
| 2020/0051964 | A1* | 2/2020 | Jung | H01L 25/167 |
| 2020/0184856 | A1* | 6/2020 | Wang | H10K 59/122 |
| 2020/0212117 | A1* | 7/2020 | Jeon | H10K 71/00 |
| 2021/0043698 | A1* | 2/2021 | Tan | H10K 77/111 |
| 2021/0408197 | A1 | 12/2021 | Zhu et al. | |

FOREIGN PATENT DOCUMENTS

| | | | | | |
|---|---|---|---|---|---|
| CN | 110828510 | A | | 2/2020 | |
| CN | 110993673 | A | * | 4/2020 | H10K 59/10 |
| CN | 111162106 | A | * | 5/2020 | H10K 59/123 |
| CN | 111384078 | A | | 7/2020 | |
| CN | 111816675 | A | | 10/2020 | |
| CN | 111863901 | A | | 10/2020 | |
| CN | 112103319 | A | | 12/2020 | |

OTHER PUBLICATIONS

Machine translation of CN-111162106-A (Year: 2020).*
International Search Report for PCT/CN2020/138247 Mailed Sep. 13, 2021.
Office Action dated Feb. 28, 2025 for CN202080003520.1 and English Translation.

* cited by examiner

DISPLAY SUBSTRATE AND DISPLAY DEVICE

CROSS-REFERENCE TO RELATED APPLICATION

The present application is a U.S. National Phase Entry of International Application PCT/CN2020/138247 having an international filing date of Dec. 22, 2020, and entitled "Display Substrate and Display Device", the contents of the above-identified application are incorporated herein by reference.

TECHNICAL FIELD

The application relates to the technical field of display, in particular to a display substrate and a display device.

BACKGROUND

At present, a bendable, foldable, and stretchable flexible display device is one of the development directions of display technology. In the related art, although film layer in the display devices, especially an inorganic layer, have certain bendability, the stretchable amount is very limited. If the display device is stretched directly, the inorganic layer, organic layer, and circuit trace in the display device will be broken or irreversibly deformed. However, if a stretching area, such as a connection unit or a hollow part, is provided in the display substrate of the flexible display device, it will occupy an area of a display area in the flexible display device, which results in low pixel density and poor display effect of the flexible display device.

Therefore, the related art of the existing flexible display devices still need to be improved.

SUMMARY

The present application is intended to solve one of the technical problems in the related art at least to some extent. For this reason, it is an object of the present application to provide a display substrate which can realize stretching deformation, and enables a display device to have high pixel density, high luminescence uniformity or good display effect during displaying.

In one aspect of the present application, the present application provides a display substrate. According to an embodiment of the present application, the display substrate includes a base substrate, the base substrate includes a stretching area and multiple display areas, wherein the multiple display areas are separated by the stretching area, and the stretching area is provided with a first connection unit connected with two adjacent display areas and a hollow part jointly defined by multiple first connection units; and light-emitting elements, the light-emitting elements are provided on one side of the base substrate, and the light-emitting elements are provided in both the stretching area and the display area. The display substrate can be stretched and deformed, and a display device having the display substrate has high pixel density, high luminescence uniformity and good display effect during displaying.

According to an embodiment of the present application, a light-emitting element located in the stretching area is provided on the first connection unit.

According to an embodiment of the present application, the light-emitting element located in the stretching area is provided on the island structure in the hollow part.

According to an embodiment of the present application, a metal trace layer is provided on one side of the base substrate, the metal trace layer extends from the display areas to the stretching area, and is electrically connected with the light-emitting elements located in the stretching area, and when the light-emitting element is provided on the first connection unit, the metal trace layer extends to the first connection unit; when the light emitting element is provided on the island structure, the metal trace layer extends to the hollow part.

According to an embodiment of the present application, the display substrate satisfies any one of the following requirements: (1) the metal trace layer is provided on a surface of the base substrate, and a first organic layer is further provided on a surface of the metal trace layer away from the base substrate, and there is an overlapping area between a first orthographic projection of the first organic layer on the base substrate and a second orthographic projection of the metal trace layer on the base substrate; (2) a first organic layer is provided on a surface of the metal trace layer away from the base substrate, and a second organic layer is provided on a surface of the metal trace layer close to the base substrate, there is an overlapping area between a first orthographic projection of the first organic layer on the base substrate, a second orthographic projection of the metal trace layer on the base substrate, and a third orthographic projection of the second organic layer on the base substrate.

According to an embodiment of the present application, the display substrate further includes a second connection unit and the second connection unit is connected with the island structure and a display area.

According to an embodiment of the present application, the display substrate further includes a second connection unit, the second connection unit is connected with the island structure and the first connection unit, and the metal trace layer extends along the second connection unit to the island structure and is electrically connected with the light-emitting element located on the island structure.

According to an embodiment of the present application, a shape of the display areas is a quadrilateral, each of four corners of each display area is respectively connected with one of the first connection units, and every four of the first connection units jointly defines one hollow part.

According to an embodiment of the present application, each of the first connection units and the second connection units is independently provided with a bending part.

According to an embodiment of the present application, each of the first connection units and the second connection units independently satisfies at least one of the following conditions: a length is 600 μm to 800 μm; a quantity of the bending parts is 1 to 2.

According to an embodiment of the present application, the light-emitting elements are at least one of organic electroluminescent elements and light-emitting diodes, and the light-emitting elements located in the stretching area are light-emitting diodes.

In another aspect of the present application, the present application provides a display device. According to an embodiment of the present application, the display device includes the display substrate described above. The display device has high pixel density, high luminescence uniformity and good display effect during displaying.

REFERENCE NUMBERS

1: display substrate; 10: stretching area; 11: first connection unit; 111: bending part; 12: hollow part; 122: island structure; 20: display area; 21*a*, 21*b*: second connection unit; 211: bending part; 201*a*, 201*b*, 201*c*: light-emitting element; 301: base substrate; 302: first buffer layer; 303: second buffer layer; 304: active layer; 305: first gate electrode; 306: second gate electrode; 307: source electrode; 308: first gate insulation layer; 309: second gate insulation layer; 310: interlayer insulation layer; 311: metal trace layer; 312: first organic layer; 313: VSS signal line; 314: light-emitting element; 315: second organic layer; 316: drain electrode; 317: encapsulation structure.

DETAILED DESCRIPTION

Embodiments of the present application are described in detail below. The embodiments described below are exemplary and are only intended to explain the present application, but should not be construed as limitation on the present application. The embodiments in which specific technologies or conditions are not indicated shall be carried out according to technologies or conditions described in documents in the art or according to a product specification.

Figure 1:
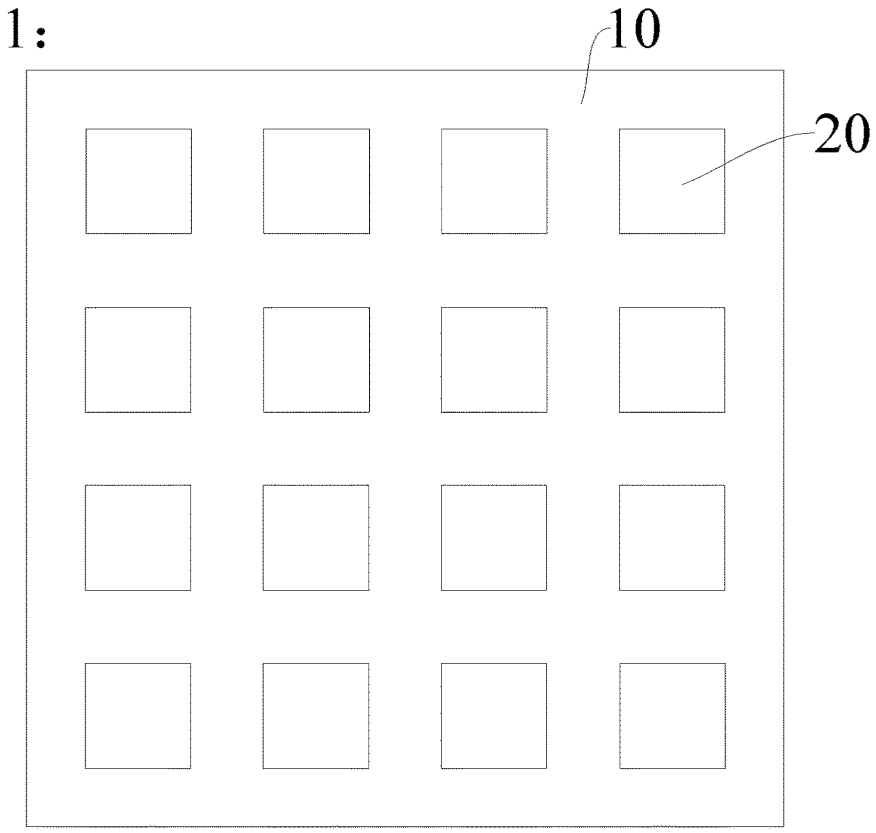
FIG. 1 shows a schematic diagram of a planar structure of a display substrate according to an embodiment of the present application.
Figure 2:
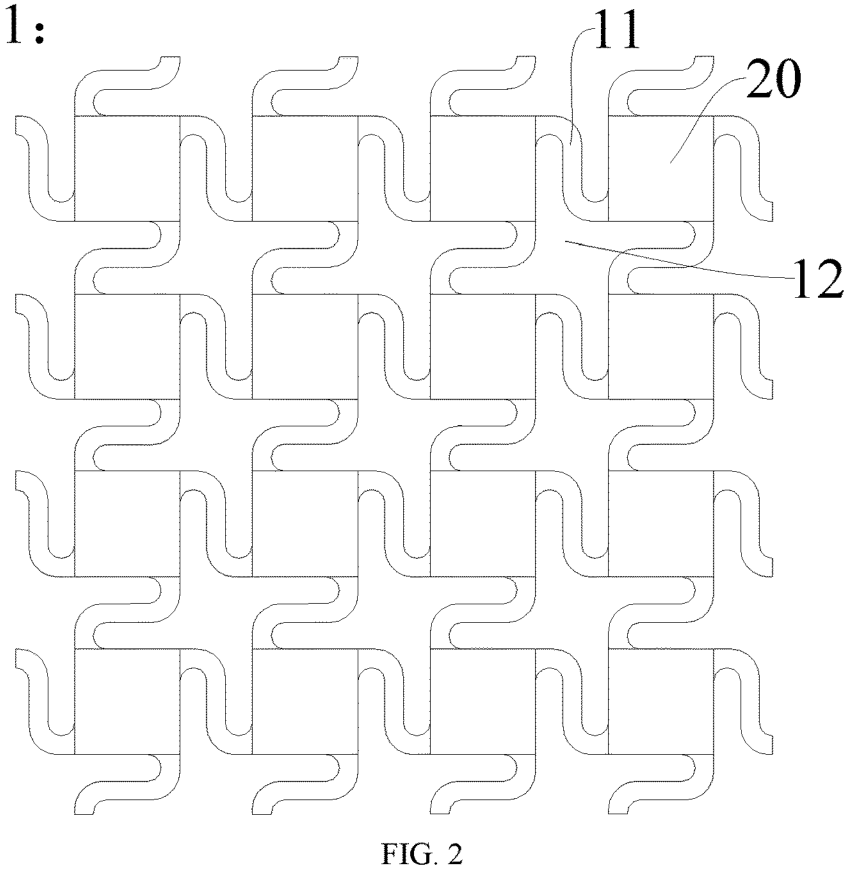
FIG. 2 shows a schematic diagram of a planar structure of a display substrate according to another embodiment of the present application.

In one aspect of the present application, the present application provides a display substrate. According to an embodiment of the present application, referring to FIG. 1, the display substrate 1 includes: a base substrate, and the base substrate has a stretching area 10 and multiple display areas 20. The multiple display areas 20 are spaced apart from each other by the stretching area 10. The stretching area 10 has a first connection unit 11 connected with two adjacent display areas 20 and a hollow part 12 jointly defined by multiple first connection units 11 (FIG. 2 may be referred to as a structural schematic diagram). The display substrate 1 further includes light-emitting elements (not shown in the figure), the light-emitting elements are disposed on one side of the base substrate, and the stretching area 10 and the display areas 20 are each provided with light-emitting elements. Since the display substrate 1 has the stretching area 10, it can be deformed by stretching. Moreover, since the display substrate 1 includes light-emitting elements not only in the display areas 20 but also in the stretching area 10, a display device having the display substrate 1 has high pixel density, high luminescence uniformity and good display effect during displaying. In addition, the above first connection unit 11 and the hollow part 12 jointly defined by the multiple first connection units 11 can release the strain at the time of stretching when the display substrate 1 is stretched, thereby achieving good stretchable deformation of the display substrate 1.

According to an embodiment of the present application, specifically, a material of the base substrate is not particularly limited, for example, in some embodiments of the present application, the material of the base substrate may include a flexible material such as polyimide, or may also be selected as polyethylene terephthalate, metal, etc. Therefore, it can enable the display substrate 1 to achieve better stretch deformation.

According to an embodiment of the present application, further, the specific shape, quantity, etc. of the first connection units 11 and the hollow part 12 in the stretching area are not particularly limited. For example, in some embodiments of the present application, referring to FIG. 2, FIG. 3, FIG. 4, FIG. 5, FIG. 6, FIG. 7, FIG. 8, FIG. 9 or FIG. 10, a shape of the display area 20 may be quadrilateral, each of the four corners of the display area 20 is respectively connected with one first connection unit 11. Every four of the first connection units 11 jointly define one hollow part 12. Therefore, the display substrate 1 has good stretching performance, and more light-emitting elements may be provided in the display area 20 and the stretching area 10 of the display substrate 1, so that a pixel density of the display device having the display substrate 1 is further improved and the display effect is further improved when realizing display.

According to an embodiment of the present application, further, a specific arrangement mode of the light-emitting elements in the display area may be an arrangement mode of light-emitting elements in a display area in a conventional display substrate, for example, the light-emitting elements 201*a* in FIG. 3, FIG. 4, FIG. 5, FIG. 6, FIG. 7, FIG. 8, FIG. 9 or FIG. 10, which are provided in the display area 20, can achieve a good light-emitting effect, thereby making the display effect of the display substrate 1 good.

Figure 3:
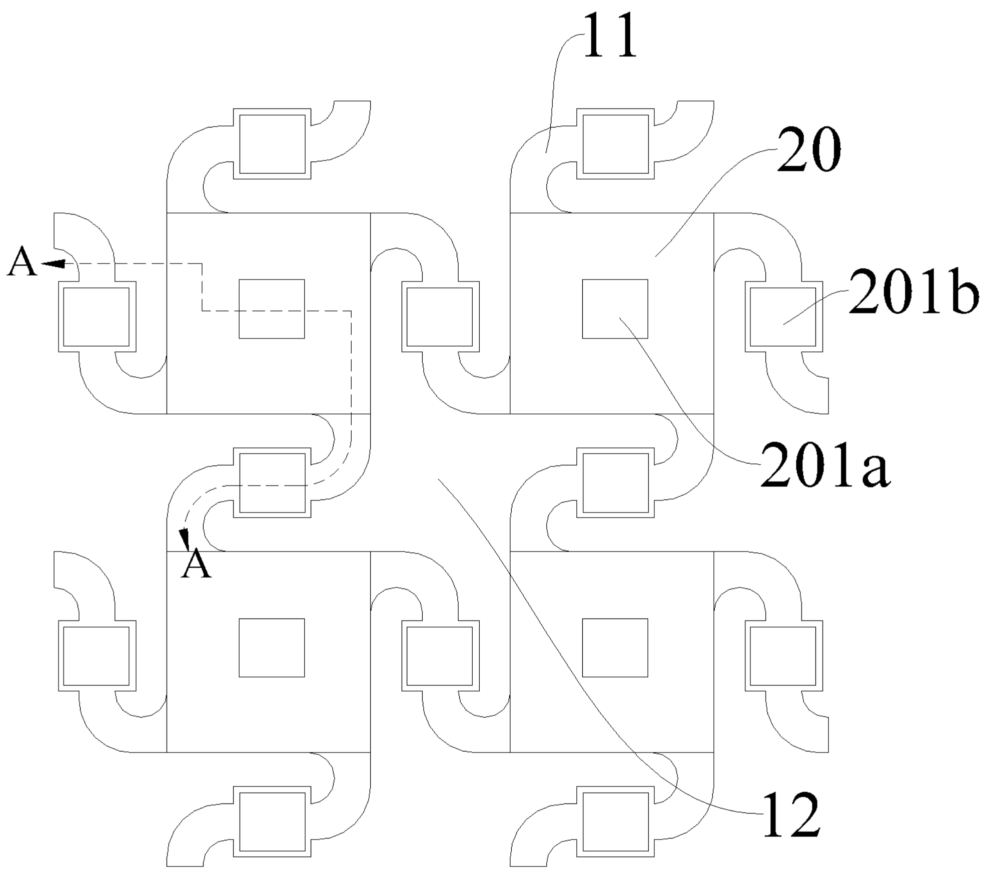
FIG. 3 shows a schematic diagram of a planar structure of a display substrate according to another embodiment of the present application.

According to an embodiment of the present application, further, a specific arrangement mode of the light-emitting elements in the stretching area will be described in detail below with reference to the accompanying drawings:

First, in some embodiments of the present application, referring to FIG. 3, a light-emitting element 201*b* located in the stretching area may be provided on the first connection unit 11. In addition, in some other embodiments of the present application, referring to FIG. 4, a light-emitting element 201*c* located in the stretching area may also be provided on the island structure 122 in the hollow part 12.

Figure 5:
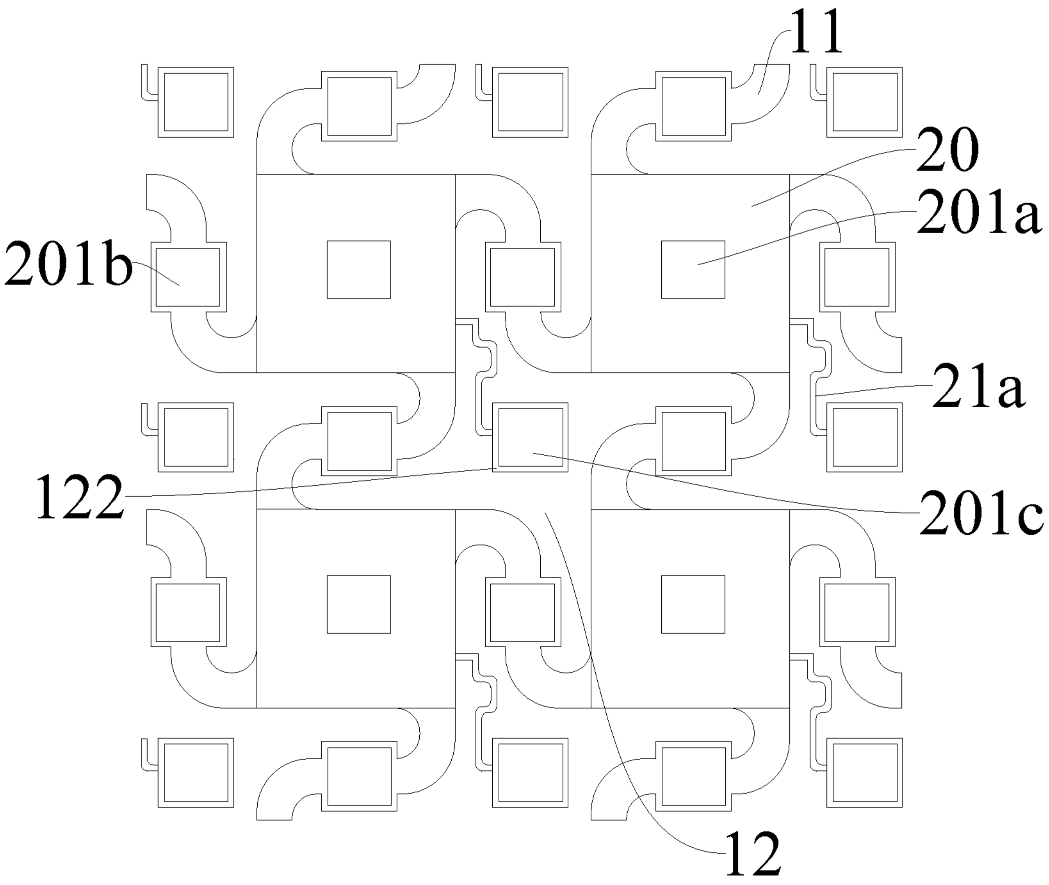
FIG. 5 shows a schematic diagram of a planar structure of a display substrate according to another embodiment of the present application.
Figure 6:
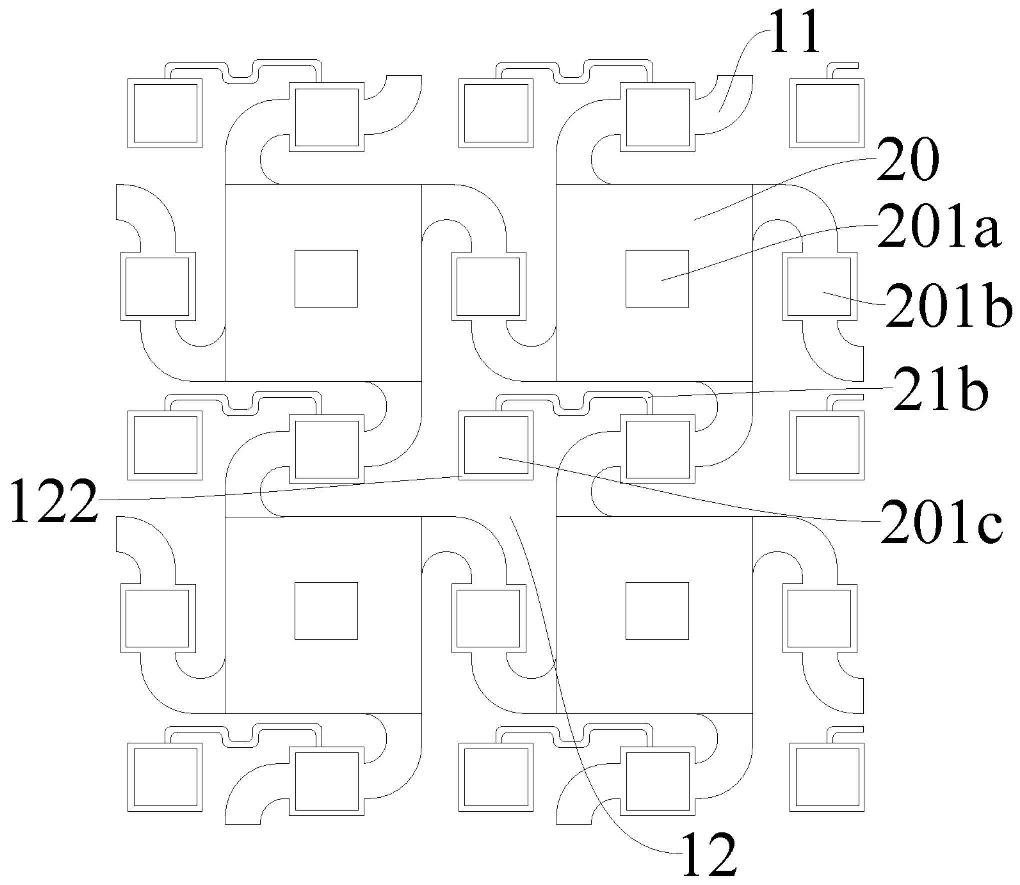
FIG. 6 shows a schematic diagram of a planar structure of a display substrate according to another embodiment of the present application.
Figure 7:
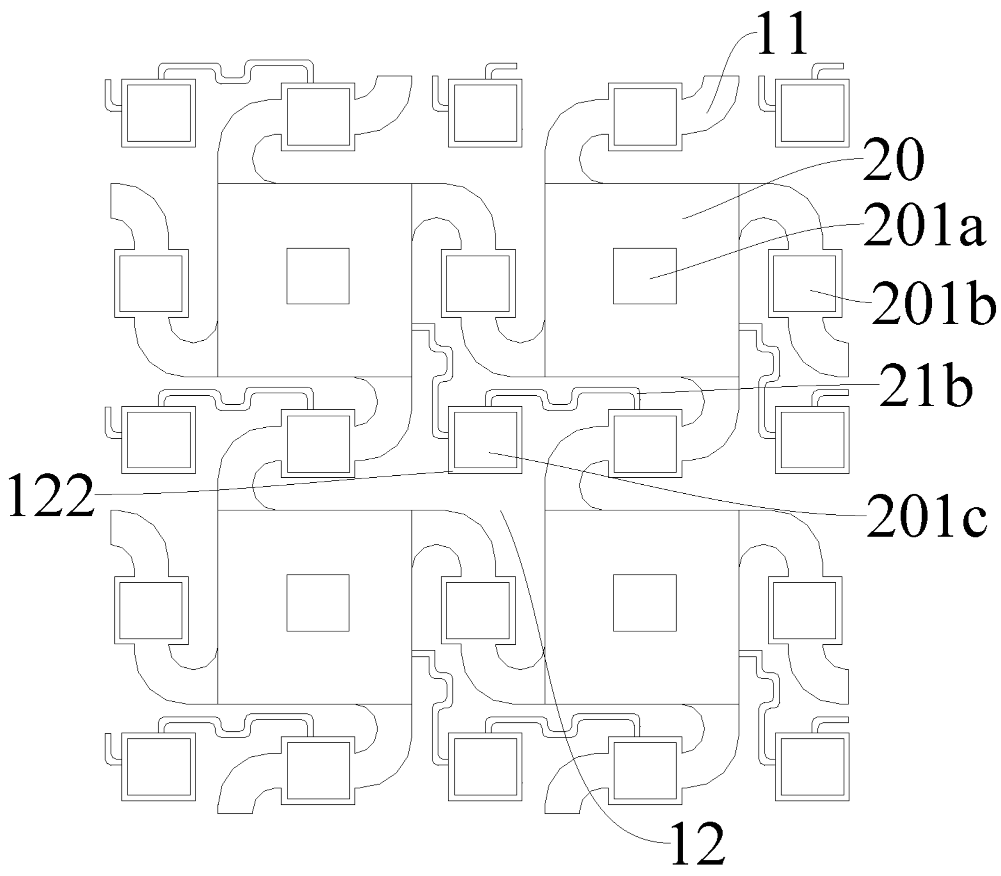
FIG. 7 shows a schematic diagram of a planar structure of a display substrate according to another embodiment of the present application.
Figure 8:
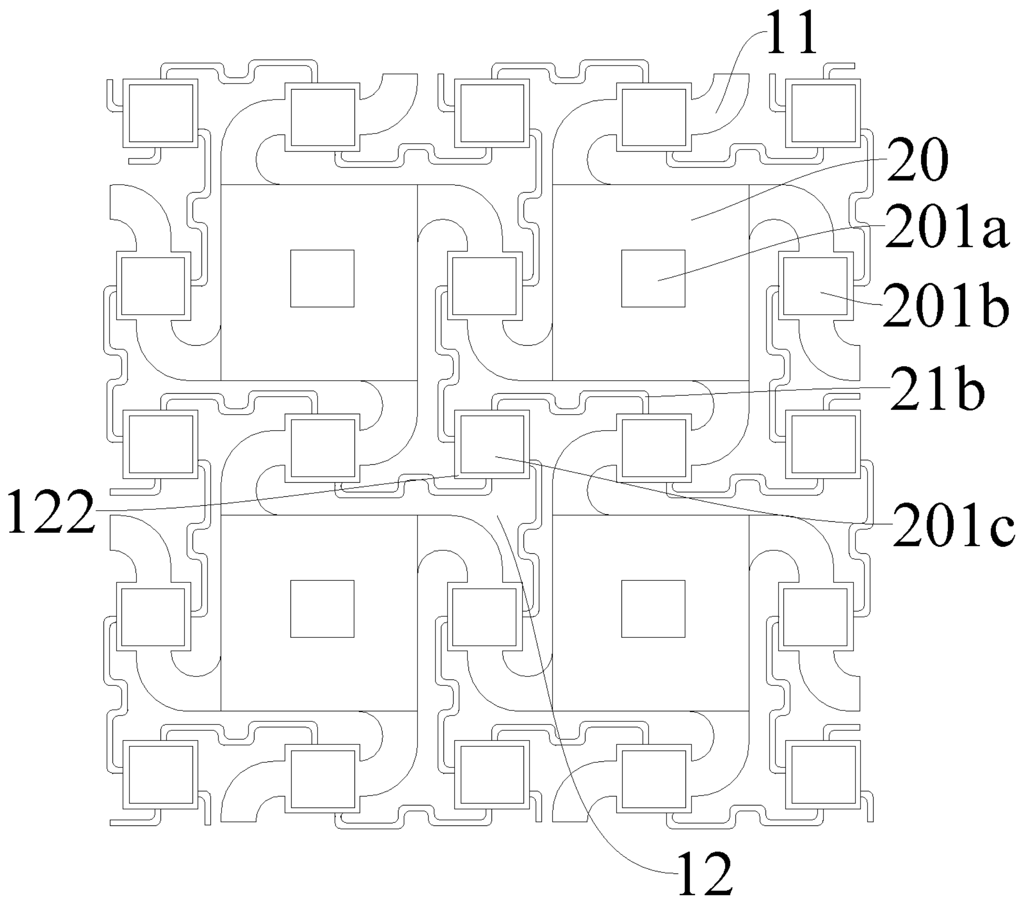
FIG. 8 shows a schematic diagram of a planar structure of a display substrate according to another embodiment of the present application.
Figure 9:
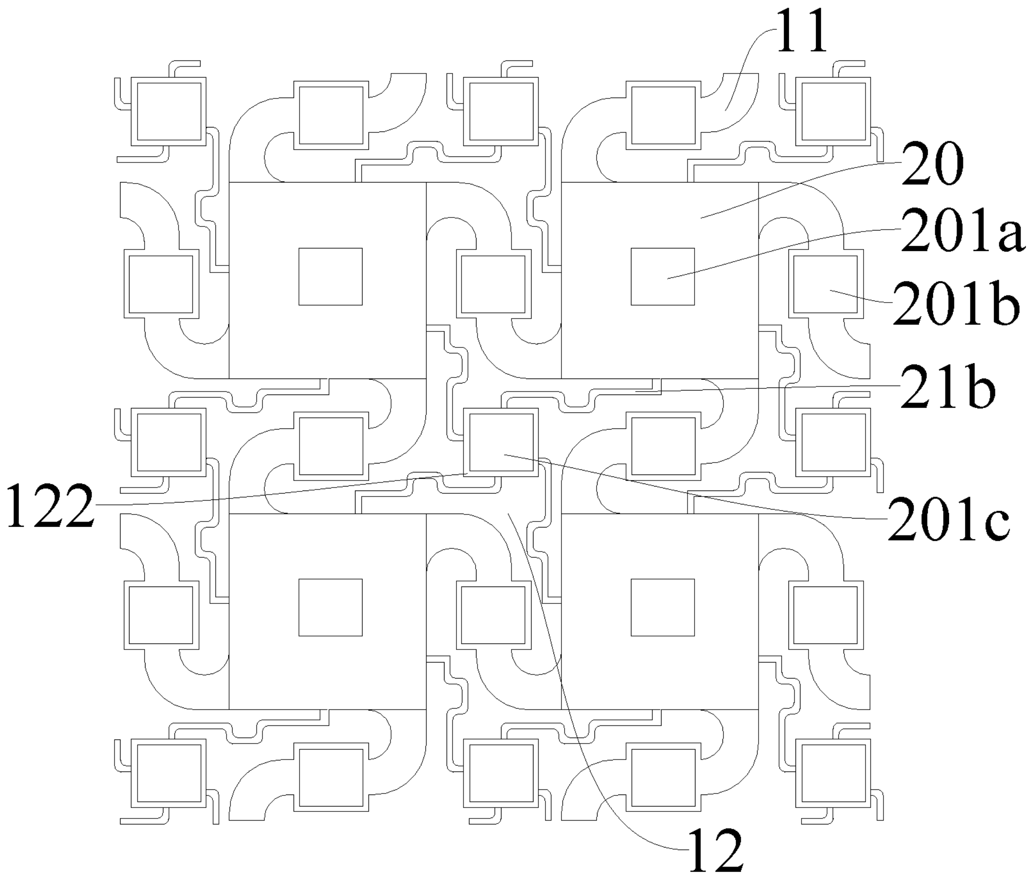
FIG. 9 shows a schematic diagram of a planar structure of a display substrate according to another embodiment of the present application.
Figure 10:
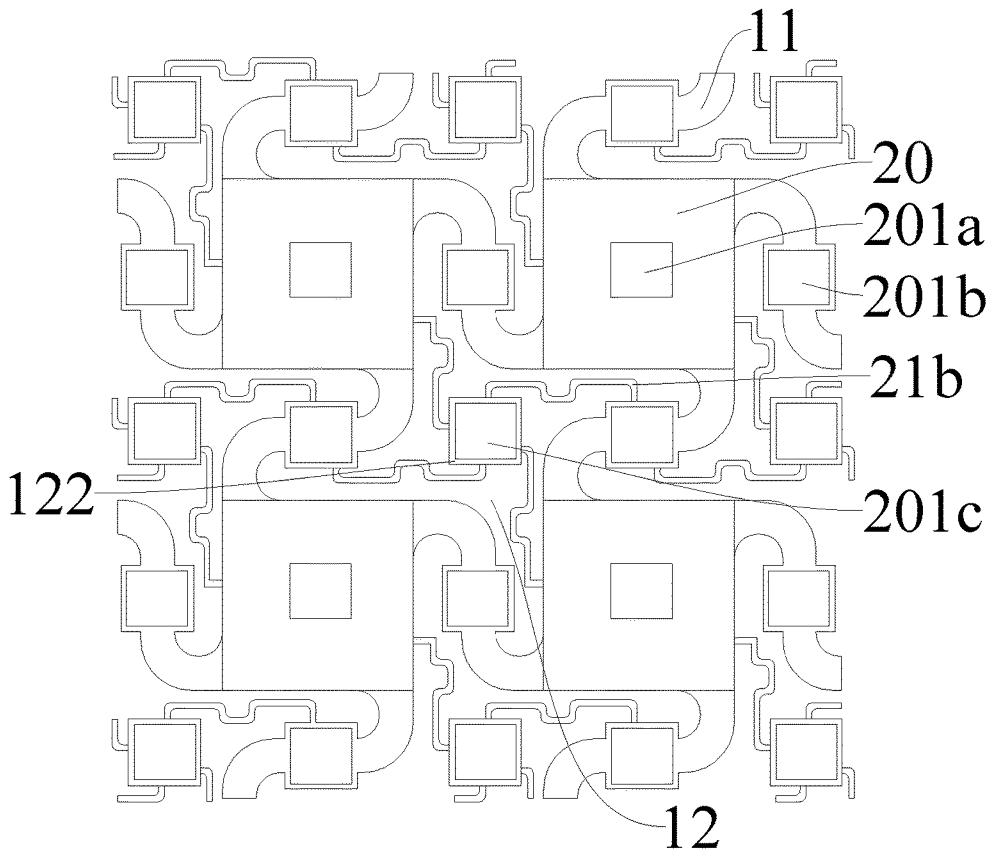
FIG. 10 shows a schematic diagram of a planar structure of a display substrate according to another embodiment of the present application.

In some other embodiments of the present application, referring to FIG. 5 when there is the light-emitting element 201*b* provided on the first connection unit 11, there may also be the light-emitting element 201*c* provided on the island structure 122 in the hollow part 12. Thus, the display substrate 1 has a simple structure, is easy to implement, can better achieve stretching and deformation, meanwhile, a display device having the display substrate 1 has high pixel density, high luminescence uniformity and good display effect at the time of display.

According to an embodiment of the present application, more specifically, a specific arrangement mode of the light-emitting elements located in the stretching area is not particularly limited, and the light-emitting elements located in the stretching area may be electrically connected with the light-emitting elements in the display area through a metal trace layer to achieve light emission. In some embodiments of the present application, referring to FIG. 3, FIG. 4, FIG. 5, FIG. 6, FIG. 7, FIG. 8, FIG. 9 or FIG. 10, a metal trace layer (not shown in the figure) is provided on one side of the base substrate, the metal trace layer extends from the display area 20 into the stretching area and is electrically connected with the light-emitting elements located in the stretching area, and when the light-emitting element is provided on the first connection unit 11 (the light-emitting element 201*b* as shown in FIG. 3), the metal trace layer extends to the first connection unit 11. When the light-emitting element is disposed on the island structure 122 (such as the light-emitting element 201*c* in FIG. 4), the metal trace layer extends to the hollow part 12. With this arrangement mode, the light-emitting elements located in the stretching area can better emit light, thereby making the display effect better, and the pixel density of the display substrate is significantly improved when realizing display.

According to an embodiment of the present application, a specific arrangement mode of the metal trace layer may be that the metal trace layer 311 is provided on a surface of the base substrate 301, and a first organic layer 312 is also provided on a surface of the metal trace layer 311 away from the base substrate 301. A first orthographic projection of the first organic layer 312 on the base substrate 301 is overlapped with a second orthographic projection of the metal trace layer 311 on the base substrate 301 (FIG. 12 may be referred to as a structural schematic diagram, it should be noted that FIG. 11, FIG. 12 and FIG. 13 in this application are all cross-sectional structural schematic views along an AA line in the display substrate shown in FIG. 3, which will not be repeated later). In addition, in some other embodiments of the present application, referring to FIG. 11 and FIG. 13, a first organic layer 312 is provided on a surface of the metal trace layer 311 away from the base substrate 301, and a second organic layer 315 is provided on a surface of the metal trace layer 311 close to the base substrate 301. There is an overlapping area between the first orthographic projection of the first organic layer 312 on the base substrate 301, the second orthographic projection of the metal trace layer 311 on the base substrate 301, and a third orthographic projection of the second organic layer 315 on the base substrate 301, so that the metal trace layer 311 is not connected with the inorganic layer in the display substrate, and thus a large strain does not occur at the metal trace layer 311 when the display substrate is stretched, so that after the display substrate is stretched, the light-emitting elements in the stretching area can still have a good display effect.

According to an embodiment of the present application, it may be understood that a compensation circuit of a light-emitting element located in the stretching area and a thin film transistor for controlling the light emission of the light-emitting element may be provided in the display area 20 (FIG. 12 may be referred to as a schematic structural diagram), may also be provided in the first connection unit 11 (FIG. 11 may be referred to as a schematic structural diagram), and may also be provided on the island structure, which may be provided according to actual needs and will not be described in detail herein. As described above, when the compensation circuit and the thin film transistor for controlling the light-emitting element located in the stretching area are provided in the display area, by extending the metal trace layer from the display area 20 into the stretching area and electrically connecting the metal trace layer with the light-emitting element located in the stretching area, the metal trace layer is extended to the first connection unit 11 when the light-emitting element is provided on the first connection unit 11 (FIG. 12 may be referred to as a schematic structure diagram). When the light-emitting element is provided on the island structure, the metal trace layer extends to the hollow part, so that the light-emitting element located in the stretching area can be well driven to emit light.

According to an embodiment of the present application, it may be understood that a manner in which the metal trace layer extends from the display area 20 into the stretching area and is electrically connected with the light-emitting element located in the stretching area is not particularly limited, and the metal trace layer and the light-emitting element may be directly connected (FIG. 11 and FIG. 13 may be referred to as schematic structural diagrams) or connected through a through hole (FIG. 12 may be referred to as a schematic structural diagram), which will not be described in detail herein.

Figure 4:
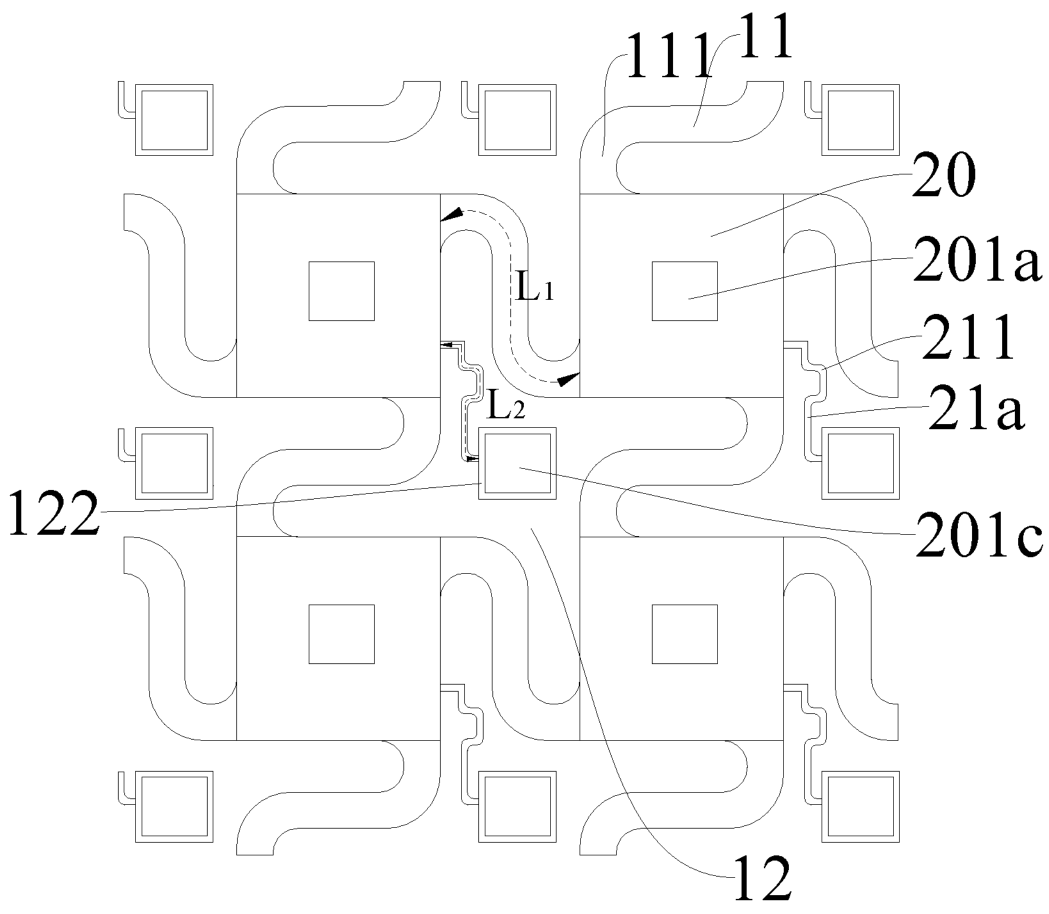
FIG. 4 shows a schematic diagram of a planar structure of a display substrate according to another embodiment of the present application.

According to an embodiment of the present application, further referring to FIG. 4 and FIG. 5, the display substrate may further include a second connection unit 21*a*, and the second connection unit 21*a* is connected with a island structure 122 and a display area 20. In some other embodiments of the present application, further referring to FIG. 6, the display substrate may further include a second connection unit 21*b*, the second connection unit 21*b* is connected with the island structure 122 and the first connection unit 11, and the metal trace layer extends along the second connection unit 21*b* to the island structure 122 and is electrically connected with a light-emitting element located on the island structure 122. Therefore, the structure of the display substrate has a simple structure and easy to implement, and with the arrangement of the second connection unit 21*a* or the second connection unit 21*b*, stretching and deformation can be better achieved, and at the same time, the light emitting element located in the hollow part 12 can emit light well, thereby enabling a display device having the display substrate to have a high pixel density, high luminescence uniformity and good display effect during displaying.

According to an embodiment of the present application, further, the quantity of the second connection units, their specific connection mode, etc. are not particularly limited. For example, in some embodiments of the present application, referring to FIG. 7, the quantity of second connection units connected to one island structure 122 may be two, wherein one second connection unit 21*b* is connected with the first connection unit 11, and the other of the second connection units is connected with the display area 20. In some other embodiments of the present application, referring to FIG. 8, the quantity of second connection units connected with one island structure 122 may be four, and all of the four second connection units 21*b* are connected to the first connection unit. In some other embodiments of the present application, referring to FIG. 9, the quantity of second connection units connected with one island structure 122 may be four, each of the four second connection units is connected to the display area 20. In addition, in some other embodiments of the present application, referring to FIG. 10, the quantity of the second connection units connected with one island structure may be four, wherein two of the second connection units 21*b* are connected with the first connection unit 11, and the other two of the second connection units are connected with the display area 20. Therefore, through the aforementioned different specific arrangement modes of the second connection units, the structure of the display substrate can be simple and easy to implement, and stretching and deformation can be better achieved. Meanwhile, the light-emitting element located in the hollow part 12 can better emit light, so that a display device having the display substrate has a higher pixel density, higher luminescence uniformity and better display effect during display.

According to an embodiment of the present application, in addition, the aforementioned first connection units and the second connection units may each have a bending part independently, for example, in some embodiments of the present application, referring to FIG. 4, the first connection unit 11 is further provided with a bending part 111. In addition, the second connection unit 21*a* is further provided with a bending part 211. Thereby, stretching property at the bending parts is better, thereby making the stretch property of the display substrate better.

According to an embodiment of the present application, further referring to FIG. 4, a length $L_1$ of a first connection unit and a length $L_2$ of a second connection unit may each independently be 600 μm-800 μm. Specifically, in some embodiments of the present application, the length $L_1$ of the first connection unit and the length $L_2$ of the second connection unit may each independently be 600 μm, 650 μm, 700 μm, 750 μm, 800 μm, or the like specifically. Thus, the length $L_1$ of the first connection unit and the length $L_2$ of the second connection unit are more suitable, and the stretching property at the bending parts is better, thereby further improving the stretch property of the display substrate.

According to an embodiment of the present application, further, the quantity of the bending parts on the first connection unit and the second connection unit is not particularly limited, and in particular, in some embodiments of the present application, the quantity of the bending parts on each of the first connection unit and the second connection unit may be one or two independently. Therefore, the quantity of the bending parts on each of the first connection unit and the second connection unit is more appropriate, and the stretching property of the display substrate can be further improved.

According to an embodiment of the present application, in particular, a specific type of the light-emitting elements is not particularly limited, for example, the light-emitting elements on the display substrate of the present application may be organic electroluminescent element or a light-emitting diode. Furthermore, when the light-emitting elements located in the stretching area are light-emitting diodes, since no encapsulation structure is required, the generated strain during stretching should be lower, thereby achieving a larger stretching amount without damaging the light-emitting elements at the same time, thus further improving the display effect in the stretching area. For example, in some embodiments of the present application, referring to FIG. 13, the light-emitting element 314 located in the display area 20 is an organic electroluminescent element, and the light-emitting element 314 located in the first connection unit 11 in the stretching area is a light-emitting diode, wherein specific structures of the organic electroluminescent element and the light-emitting diode may be the specific structures of the conventional organic electroluminescent element and the light-emitting diode in the related art, which will not be described in detail herein.

Figure 11:
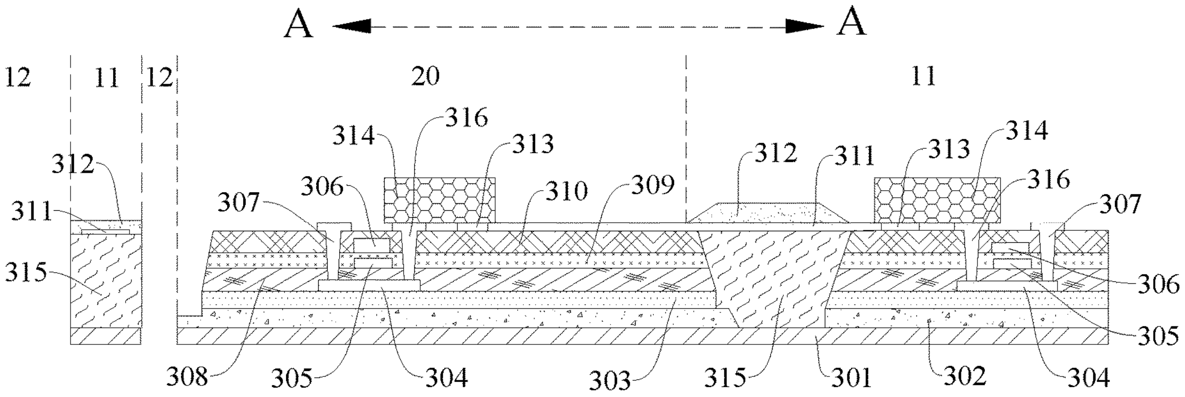
FIG. 11 shows a schematic diagram of a cross-sectional view of a structure along an AA line of the display substrate in FIG. 3 of the present application.
Figure 12:
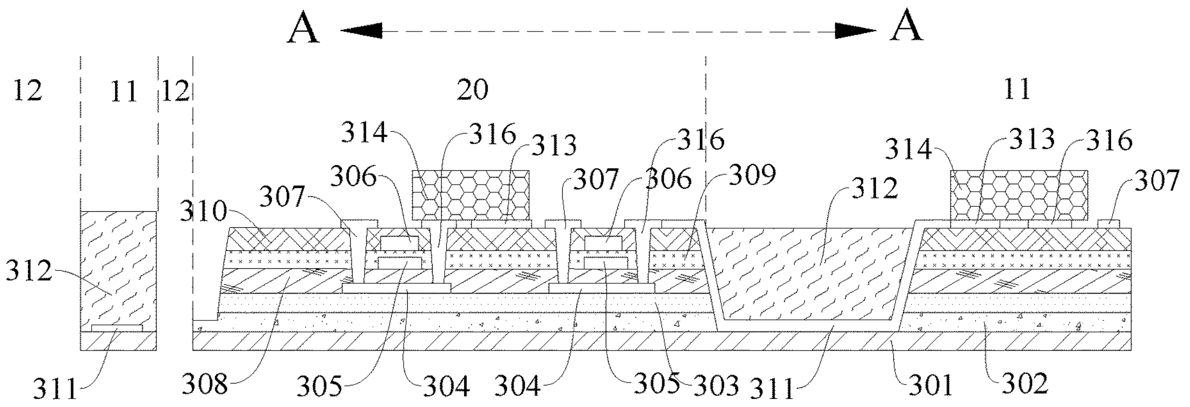
FIG. 12 shows another schematic diagram of a cross-sectional view of a structure along an AA line of the display substrate in FIG. 3 of the present application.
Figure 13:
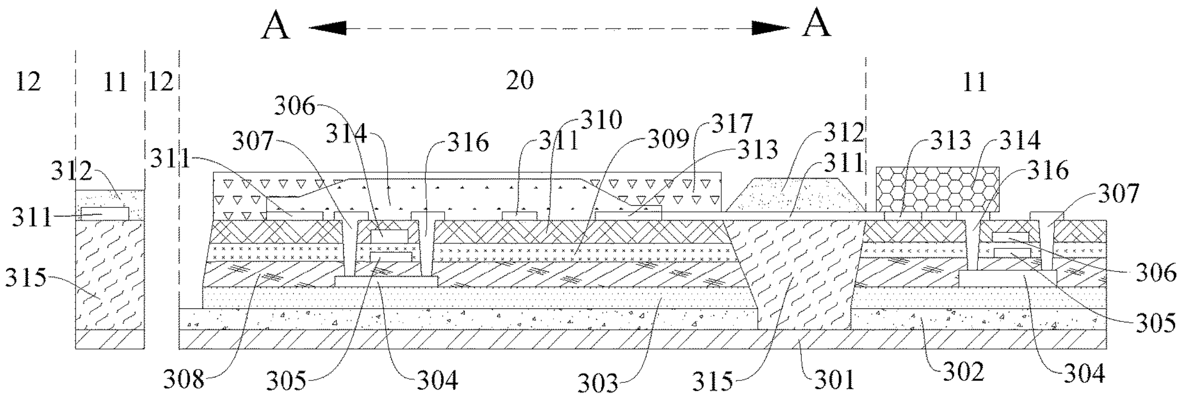
FIG. 13 shows another schematic diagram of a cross-sectional view of a structure along an AA line of the display substrate in FIG. 3 of the present application.

Specifically, in some embodiments of the present application, referring to FIG. 11, FIG. 12 and FIG. 13, the display substrate may further include structures in a conventional display substrate, for example, a first buffer layer 302, a second buffer layer 303, an active layer 304, a first gate electrode 305, a second gate electrode 306, a source electrode 307, a first gate insulation layer 308, a second gate insulation layer 309, an interlayer insulation layer 310, a VSS signal line 313, and a drain electrode 316. When the light emitting element 314 is an organic electroluminescent element, it may be understood that the display substrate may further include a encapsulation structure 317 (FIG. 13 may be referred to as a schematic structure diagram), wherein specific arrangement modes of the aforementioned structures may be the same as specific arrangement modes of the structures in the related art, which will not be described in detail herein.

According to an embodiment of the present application, it may be understood that when the light-emitting element 314 is an organic electroluminescent element, it may further include the specific structure of a conventional organic electroluminescent element, for example, a cathode, an anode, a light-emitting layer, a pixel define layer, etc, specific structures of which are the same as the specific structures in the conventional organic electroluminescent elements, which will not be described in detail herein.

According to an embodiment of the present application, it may be understood that when the light-emitting element 314 is a light-emitting diode, it may further include a specific structure of a conventional light-emitting diode, which will not be described in detail herein.

According to an embodiment of the present application, it may be understood that, for each film layer mentioned above, a material of an inorganic layer may be in a single layer or multiple layers of inorganic layer made of silicon oxide, silicon nitride, silicon oxynitride or the like. A specific material of an active layer may be an inorganic semiconductor material, such as amorphous silicon, polycrystalline silicon and the like, or may be an organic semiconductor material, it may also be an oxide semiconductor material such as Zn, In or Ga. A material of the metal trace layer and metal leads, such as source electrodes and drain electrodes, may be a conductive metal such as Ti, Al, Mo or Ag, or may be Indium Tin Oxide (ITO), Indium Zinc Oxide (IZO), Zinc Oxide (ZnO) or $In_2O_3$, Indium Gallium Oxide (IGO), Zinc Aluminium Oxide (AZO) and other conductive oxides, the material may also be conductive materials with high ductility such as rubber mixed with conductive particles, for example, carbon nanotubes, nano silver lines. Materials of the first organic layer and the second organic layer may be polymers of polymethyl methacrylate and polystyrene, polymer derivatives of phenol groups, polymers of acrylic, polymers of p-xylene, polymers of aromatic ethers, polymers of amides, polymers of fluorides, polymers of p-xylene, polymers of vinyl alcohol, and mixtures of the above polymers. Therefore, materials are widely sourced, readily available and have low costs.

According to an embodiment of the present application, it may be understood that when the light-emitting element 314 is an organic electroluminescent element, a material of its anode and the cathode may be a conductive metal such as Ti, Al, Mo or Ag, or may also be ITO, IZO, ZnO, $In_2O_3$, conductive oxides such as IGO or AZO. A material of the pixel define layer may be a polymer of polymethyl methacrylate and polystyrene, a polymer derivative of a phenol group, a polymer of acrylic, a polymer of p-xylene, a polymer of aromatic ether, a polymer of amide, a polymer of fluoride, a polymer of p-xylene, a polymer of vinyl alcohol, a mixture of the above polymers, and the like. A material of the light-emitting layer may be a phosphorescent luminescent material or a fluorescent luminescent material. An encapsulation structure may be either an inorganic-organic-inorganic stacked encapsulation structure or an inorganic encapsulation structure, wherein the inorganic material may be in a single layer or multiple layers of inorganic layers made of silicon oxide, silicon nitride, silicon oxynitride or the like, or a dense film layer of aluminum oxide, aluminum nitride, titanium nitride or the like. The organic materials in the encapsulation structure may be polymethacrylate, polycarbonate, acrylic, epoxy resin, etc., which may be formed by ink-jet printing process, patterning process, etc., wherein the patterning process may be a coating process or lithography process, which may be the same as the processes in the related art, and will not be described in detail herein.

According to an embodiment of the present application, it may be understood that in a manufacturing process of the display substrate, a protective film layer may be attached to the base substrate through an optical clear adhesive (OCA) adhesive material, and a material of the protective film layer may be dimethylsiloxane, polyimide, polyethylene terephthalate, etc., which will not be described in detail herein. Therefore, materials are widely sourced, readily available and have low costs.

In another aspect of the present application, the present application provides a display device. According to an embodiment of the present application, the display device includes the display substrate described above. The display device has high pixel density, high luminescence uniformity and good display effect during displaying.

According to an embodiment of the present application, the display device may include other necessary structures and compositions besides the display substrate described above, and those skilled in the art may make supplements and designs according to specific types and use requirements of the display device, which will not be described in detail herein.

According to an embodiment of the present application, a specific type of the display device is not particularly limited, for example, it includes but is not limited to a mobile phone, a tablet computer, a wearable device, a game machine, a television set or a vehicle-mounted display, etc.

In addition, terms such as "first" and "second" are used herein for purposes of description and are not intended to indicate or imply relative importance or significance. Therefore, a feature defined by "first" and "second" may explicitly or implicitly indicate inclusion of one or more such features. In the description of the present application, meaning of "multiple" is two or more than two, unless otherwise explicitly defined.

Reference terms throughout this specification, such as "an embodiment," "some embodiments," "an example," "a specific example," or "some examples," means that a particular feature, structure, material, or characteristic described in connection with the embodiment or example is included in at least one embodiment or example of the present disclosure. In this specification, a schematic expression of the above terms does not necessarily refer to the same embodiment or example. Moreover, the specific feature, structure, material, or characteristic described may be combined in a proper way in any one or more embodiments or examples. In addition, if there is no conflict, a person skilled in the art may combine different embodiments or examples described in this specification and the features of different embodiments or examples.

Although embodiments of the present application have been shown and described above, it should be understood that the above embodiments are exemplary, but will not be understood as the limitations on the present application. Alterations, modifications, substitutions and variations to the above embodiments may be made by those skilled in the art within the scope of the present application.

The invention claimed is:

1. A display substrate, comprising:

a base substrate, the base substrate comprises a stretching area and a plurality of display areas, wherein the plurality of display areas are separated by the stretching area, and the stretching area is provided with a first connection unit connected with two adjacent display areas and a hollow part jointly defined by a plurality of first connection units; and light-emitting elements, the light-emitting elements are provided on one side of the base substrate, and the light-emitting elements are provided in both the stretching area and the display areas;

wherein light-emitting elements located in the stretching area are provided on the first connection unit and on an island structure in the hollow part;

a metal trace layer is provided on one side of the base substrate, the metal trace layer extends from the display areas to the stretching area, and is electrically connected with the light-emitting element located in the stretching area, and the metal trace layer extends to the first connection unit;

a first organic layer is provided on a surface of the metal trace layer away from the base substrate, and a second organic layer is provided on a surface of the metal trace layer close to the base substrate, an overlapping area is formed between a first orthographic projection of the first organic layer on the base substrate, a second orthographic projection of the metal trace layer on the base substrate, and a third orthographic projection of the second organic layer on the base substrate; and the display substrate further comprises a second connection unit, the second connection unit is directly connected with the island structure and the first connection unit.

2. The display substrate according to claim 1, wherein the metal trace layer extends to the hollow part.

3. The display substrate according to claim 2, wherein another second connection unit is connected with the island structure and one of the display areas.

4. The display substrate according to claim 2, wherein the metal trace layer extends along the second connection unit to the island structure and is electrically connected with the light-emitting element located on the island structure.

5. The display substrate according to claim 2, wherein a shape of each display area is quadrilateral, each of four corners of the display area is respectively connected with one of the first connection units, and every four of the first connection units jointly define one hollow part.

6. The display substrate according to claim 1, wherein another second connection unit is connected with the island structure and one of the display areas.

7. The display substrate according to claim 6, wherein each of the first connection unit and the second connection unit is independently provided with a bending part.

8. The display substrate according to claim 7, wherein each of the first connection unit and the second connection unit independently satisfies at least one of the following conditions:

a length is 600 μm to 800 μm;

a quantity of the bending parts is 1 to 2.

9. The display substrate according to claim 1, wherein the metal trace layer extends along the second connection unit to the island structure and is electrically connected with the light-emitting element located on the island structure.

10. The display substrate according to claim 1, wherein a shape of each display area is quadrilateral, each of four corners of the display area is respectively connected with one of the first connection units, and every four of the first connection units jointly define one hollow part.

11. The display substrate according to claim 1, wherein the light-emitting elements are at least one of organic electroluminescent elements and light-emitting diodes, and the light-emitting element located in the stretching area is a light-emitting diode.

12. A display device, comprising the display panel according to claim 1.

* * * * *